United States Patent
Chu et al.

(10) Patent No.: US 7,741,621 B2
(45) Date of Patent: Jun. 22, 2010

(54) APPARATUS AND METHOD FOR FOCUSED ELECTRIC FIELD ENHANCED PLASMA-BASED ION IMPLANTATION

(75) Inventors: Paul K. Chu, Hong Kong (CN); Liuhe Li, Beijing (CN)

(73) Assignee: City University of Hong Kong, Hong Kong (CN)

( * ) Notice: Subject to any disclaimer, the term of this patent is extended or adjusted under 35 U.S.C. 154(b) by 1679 days.

(21) Appl. No.: 10/891,309

(22) Filed: Jul. 14, 2004

(65) Prior Publication Data

US 2006/0013964 A1    Jan. 19, 2006

(51) Int. Cl.
*H01J 37/317* (2006.01)
*C23C 14/00* (2006.01)

(52) U.S. Cl. .............. 250/492.21; 250/492.3; 250/288; 118/723 FI; 438/513; 356/316

(58) Field of Classification Search ............ 250/492.21, 250/492.3, 288; 118/723 FI; 438/513; 356/316
See application file for complete search history.

(56) References Cited

U.S. PATENT DOCUMENTS

| | | | | |
|---|---|---|---|---|
| 5,354,381 A | * | 10/1994 | Sheng | 118/723 E |
| 5,654,043 A | * | 8/1997 | Shao et al. | 427/527 |
| 5,911,832 A | * | 6/1999 | Denholm et al. | 118/723 E |
| 6,025,252 A | * | 2/2000 | Shindo et al. | 438/509 |
| 6,120,660 A | * | 9/2000 | Chu et al. | 204/298.15 |
| 2007/0138388 A1 | * | 6/2007 | Ward et al. | 250/288 |
| 2007/0158555 A1 | * | 7/2007 | Ward et al. | 250/309 |

* cited by examiner

*Primary Examiner*—Nikita Wells
(74) *Attorney, Agent, or Firm*—Heslin Rothenberg Farley & Mesiti P.C.

(57) ABSTRACT

There is disclosed an apparatus and method for focused electric field enhanced plasma-based ion implantation. The apparatus includes an implantation chamber, a vacuum pump for maintaining the pressure in the implantation chamber at a desired level, a sample holder, means for applying a negative potential to the sample holder, and means for supplying a gaseous or vaporized implantation material. The supplying means takes the form of a feed conduit having an exit opening located in the implantation chamber above the sample holder, and when a negative potential is applied to the sample holder the exit opening of the feed conduit is maintained at a potential that is positive relative to the sample holder.

14 Claims, 3 Drawing Sheets

APPARATUS AND METHOD FOR FOCUSED ELECTRIC FIELD ENHANCED PLASMA-BASED ION IMPLANTATION

FIELD OF THE INVENTION

The present invention relates to an apparatus and method for Plasma-Based Ion Implantation (PBII), and in particular though not exclusively to such a method that is suitable for use with implantation materials that have a low melting point and high vapor pressure.

BACKGROUND OF THE INVENTION

Focused Electric Field Enhanced Plasma-Based Ion Implantation (FEFE-PBII) relates to a process for focused electric field enhanced plasma apparatus and methods and the following plasma-based ion implantation. One of the techniques belonging to the family of plasma-based ion implantation is plasma immersion ion implantation (PIII), which is a useful niche technology for the modification of surface properties of materials and industrial components, especially such materials and components that are large or that have an irregular shape. The samples are immersed in plasma from which ions are extracted and implanted in the surface of the samples.

PRIOR ART

Conventionally, in a PBII method, a plasma source is provided to supply the ions for implantation. Typically the plasma may be generated by, for example, thermionic discharge, pulsed high-voltage glow discharge, radio frequency plasma sources, microwave plasma sources, cathodic arc metal plasma sources and sputtering targets amongst other possibilities. After the plasma has been generated, a negative potential is applied to the sample holder which negative potential serves to attract positive ions out of the plasma and to accelerate them towards the sample where they are implanted. A problem with conventional techniques, however, is that there does not exist a single plasma source that is capable of generating a plasma containing ions of all possible elements. For example, it is very difficult to generate a plasma containing positive ions of solid materials with poor electrical conductivity such as sulfur, phosphorous and boron, and poorly or semiconducting materials such as silicon, germanium and elements with low melting points and high vapor pressure. Unfortunately many of these materials that are difficult to implant are materials where the ability to perform PIII would be very desirable.

SUMMARY OF THE INVENTION

According to the present invention there is provided apparatus for focused electric field enhanced plasma-based ion implantation comprising, an implantation chamber, a vacuum pump for maintaining the pressure in said implantation chamber at a desired level, a sample holder, means for applying a negative potential to said sample holder, and means for supplying a gaseous or vaporized implantation material, wherein said supplying means comprises an feed conduit having an exit opening located in said implantation chamber above said sample holder, and wherein when said negative potential is applied to said sample holder said exit opening of said feed conduit is maintained at a potential that is positive relative to said sample holder.

In a preferred embodiment of the invention the apparatus further comprises an evaporating and supply means for generating vaporized implantation material and for supplying said vaporized implantation material to said inlet conduit. Preferably, for example, the evaporating and supply means comprises an evaporation chamber for receiving a source of said implantation material, and a heating means for generating vaporized implantation material from the source. The heating means preferably surrounds the evaporation chamber.

The evaporation chamber may be formed with an opening for allowing vaporized source material to exit the evaporation chamber, with the opening having a relatively small dimension compared with the internal area of said evaporation chamber. For example the ratio of the opening to the top area of the evaporation chamber is greater than 4. Preferably the evaporating and supply means is removable from said apparatus.

According to another aspect of the invention there is provided a method for performing plasma-based ion implantation comprising, locating a sample on a sample holder in an implantation chamber, supplying gaseous or vaporized implantation material to said implantation chamber through a conduit, said conduit having an exit opening located in said implantation chamber and above said sample holder, and applying a negative potential to said sample holder while maintaining said exit opening at a potential that is positive relative to said sample holder so as to generate an electron focused electric field between said sample holder and said exit opening effective to generate ions from said gaseous or vaporized implantation material and to accelerate said thus generated ions towards said sample for implantation therein.

In a preferred embodiment the method comprises forming an electron focused electric field to enhance the ionization of the plasma, and where the electron focused electric field is formed by the small exit opening and the large area sample holder.

Preferably a negative potential is applied to said sample holder as a series of pulses and maintaining said exit opening grounded. The pressure in said implantation chamber is preferably maintained above a breakdown pressure.

The implantation material may be generated by evaporating a source material in an evaporation chamber to generate a vapor, and wherein said vapor is fed to said feed conduit through a feed conduit. The vapor may be fed to said feed conduit with a carrier gas. The vapor is preferably generated in said evaporation chamber in a state of quasi-equilibrium. To achieve this the evaporation chamber may provided with an exit opening through which vapor escapes to pass to said feed conduit, and wherein the dimensions of said exit opening are relatively small compared to the internal dimensions of the evaporation chamber and wherein the diameter of the feed conduit is relatively small compared to its length to maintain said quasi-equilibrium state.

Alternatively the implantation material may be gaseous and is supplied to said inlet conduit.

Preferably the pressure in said implantation chamber is maintained above a breakdown pressure to maintain a steady-state glow discharge between said sample holder and said exit opening of said inlet conduit.

According to a further aspect of the present invention there is provided a method of performing plasma based ion implantation comprising feeding a gaseous or vaporized implantation material to an implantation chamber through an inlet conduit, supporting a sample to be implanted on a sample holder, and generating a glow-discharge between said sample holder and an exit opening of said feed conduit by applying a negative potential to said sample holder, whereby ions of said implantation material are generated and accelerated towards said sample.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
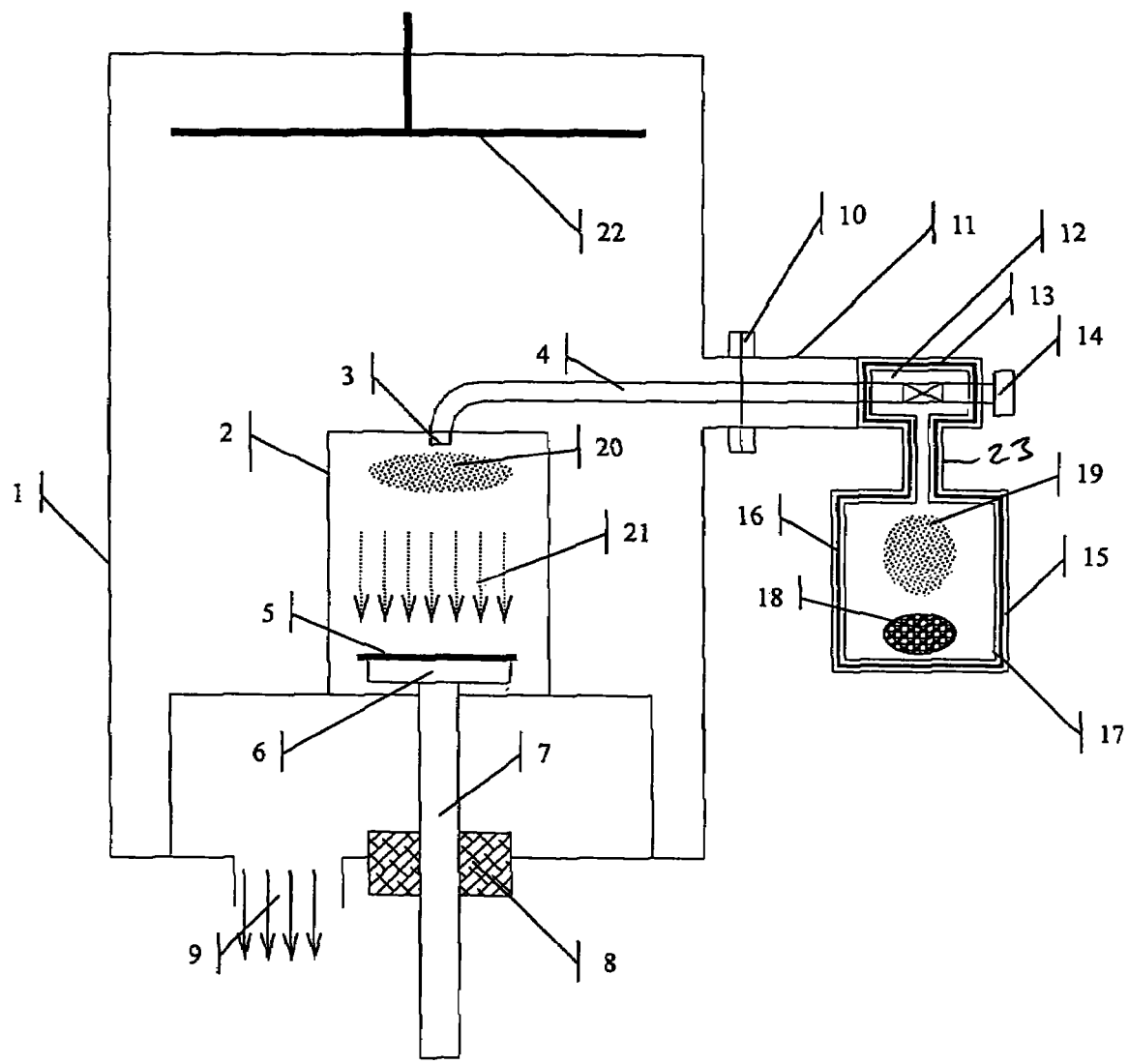
FIG. 1 is a sectional view through a FEFE-PBII apparatus according to an embodiment of the present invention.

Referring firstly to FIG. 1 there is shown a FEFE-PBII apparatus according to an embodiment of the invention comprising a vacuum chamber 1 the pressure in which can be reduced to any desired level by means of a vacuum pump 9. Within the vacuum chamber is provided an implantation chamber 2 in which is located a sample holder 6 for supporting a sample 5 to be implanted with ions. The implantation chamber 2 is a smaller chamber made of an insulating material such as glass which serves to protect the remainder of the vacuum chamber from contamination by the vapor that is supplied to the chamber 2 as will be discussed below. The implantation chamber 2, being made of an insulating material, also serves to electrically isolate the sample holder 6 from the exit opening 3 of the feed conduit 4 for reasons that will be understood from the description below. The implantation chamber 2 may be removed completely if the vacuum chamber 1 is to be used as part of a conventional PBII apparatus. The vacuum chamber 1 can also be removed completely if the implantation chamber 2 is also used as the vacuum chamber to conduct FEFE-PBII. Sample holder 6 is formed at the end of a conductive rod 7 which extends though a wall of the vacuum chamber 1 through an insulating ring 8. An upper region of the vacuum chamber 1 is provided with a conventional plasma generating means 22 which may take any conventional form. Plasma generating means 22 is provided simply to enable the apparatus to function in a conventional manner (with the implantation chamber 2 removed) in addition to the novel manner to be described below, and plasma generating means 22 will therefore not be described in detail.

To one side of the vacuum chamber 1 there is provided a means for vaporizing a solid material 18. This vaporizing means comprises an evaporation chamber 17, a heating device 16 and a thermally insulating shield 15 designed to ensure that heat generated by the heating device 16 is directed into the evaporation chamber 17 for greater efficiency rather than externally of the evaporation chamber 17. At the top of the evaporation chamber 17 there is formed a neck 23 that connects the evaporation chamber 17 to the feed conduit 4 that leads through a side wall of the vacuum chamber 1 to the top of the implantation chamber 2 where the feed conduit 4 is formed with an exit opening 3 into the implantation chamber 2 located above the sample 5.

If it is desired to form a plasma containing ions of an element with a low melting point, such as for example sulfur, a sample of sulfur (solid material 18) is placed within the evaporation chamber 17 and is vaporized to form a vapor 19 by the application of heat through heating device 16. Heating device 16 may be any convenient heating device such as, for example, a high frequency heating device. In the embodiment of FIG. 1 the heating device 16 surrounds the evaporation chamber 17, but alternatively the heating device 16 may be located simply at the bottom of the evaporation chamber 17. The vaporized sulfur is then allowed to escape from the evaporation chamber 17 through the neck 23 of the evaporation chamber which neck 23 has a diameter that is relatively small compared to the size of the evaporation chamber 17 so that the sulfur vapor may be in a quasi-equilibrium state within the evaporation chamber 17. Generally, the ratio of the entrance area of the neck 23 to the top area of the evaporation chamber 17 should be more than 4.

The sulfur vapor 19 that escapes from the evaporation chamber 17 is fed to the feed conduit 4 through an input valve 12 controlled by manually operable valve control means 14. Input valve 12 is provided with a valve heating means 13 similar to heating device 16 in order to prevent the sulfur vapor being deposited in the input valve 12 or in the feed conduit 4. The vaporized sulfur then passes along the feed conduit 4 (which is surrounded by an insulating wall 11 again to prevent cooling and deposition of the sulfur) to the exit opening 3 into the implantation chamber 2. Optionally, means may be provided for supplying an inert carrier gas such as argon to facilitate the transfer of the sulfur vapor along the feed conduit 4. The carrier gas can be fed in from side wall of the evaporation chamber 17 or other places around the chamber not shown here.

It should also be noted that the evaporation chamber 17 and heating device 16, input valve 12 and input valve heating means 13, together with the first part of the feed conduit 4 surrounded by a thermally insulating wall 11, form an integral unit for vaporizing solid state materials and other materials and for supplying the resulting vapor into the PBII apparatus. This integral vaporizing and supply means is connected to the remainder of the PBII apparatus by means of a quick release flange 10. By means of the quick release flange 10, the integral vaporizing and supply means may be removed if not needed and in its place a supply conduit for a gaseous plasma forming material may be used if the material to be implanted is one that is gaseous under standard conditions. Alternatively the feed conduit 4 may be closed off altogether and plasma may be supplied to the vacuum chamber 1 in a conventional manner elsewhere, and the implantation chamber 2 may be removed, thus allowing an embodiment of the invention to be integrated into a conventional PBII apparatus.

As discussed above, the sample 5 in which the ions are to be implanted is supported on a sample holder 6 made of a conducting material and the sample holder 6 is supported on an electrically conductive rod 7. In use of the embodiment of FIG. 1, the conductive rod 7 and the sample holder 6 are connected to a source of negative potential and a highly negative voltage (eg 15 kV) is applied to the sample holder 6. The negative potential may be applied as a series of pulses, or in a long-pulse pseudo DC manner. In contrast the feed conduit 4, thermally insulating wall 11, and the shield 15 surrounding the evaporation chamber 16 are all electrically grounded, therefore an electric field is established between the exit opening 3 of the feed conduit 4 (which is grounded and thus acts as an anode) and the negatively charged sample holder 6. The area of the exit opening 3 is much less than that of the sample holder 6. The electrons in the plasma as well as the secondary electron exited from the sample holder 6 will all fly to the exit opening 3, a focused electric field is formed between the exit opening 3 and the sample holder 6. To form this focused electric field, the ratio of the anode (exit opening 3) to cathode (sample holder 6) should be more than 6. The electric field acts to ionize the sulfur vapor entering the implantation chamber 2 through the exit opening 3 forming an electron cloud/plasma 20. Sulfur ions are then accelerated in the direction of arrows 21 under the influence of the electric field and are accelerated towards the sample 5 in which they are then implanted.

Figure 2:
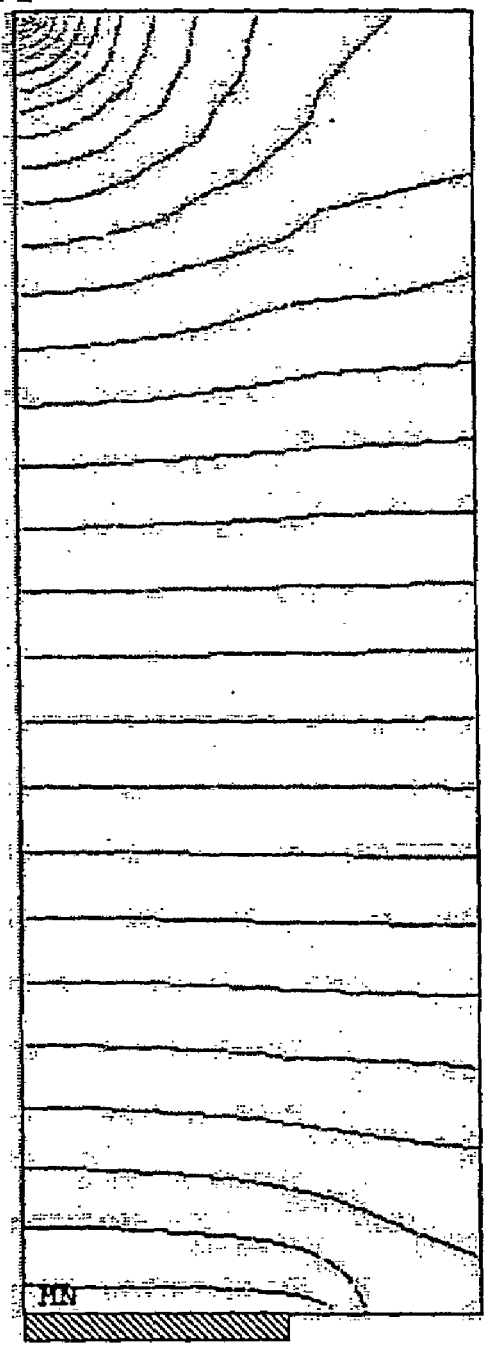
FIG. 2 illustrates the electric field lines in the implantation chamber in the embodiment of FIG. 1.
Figure 3:
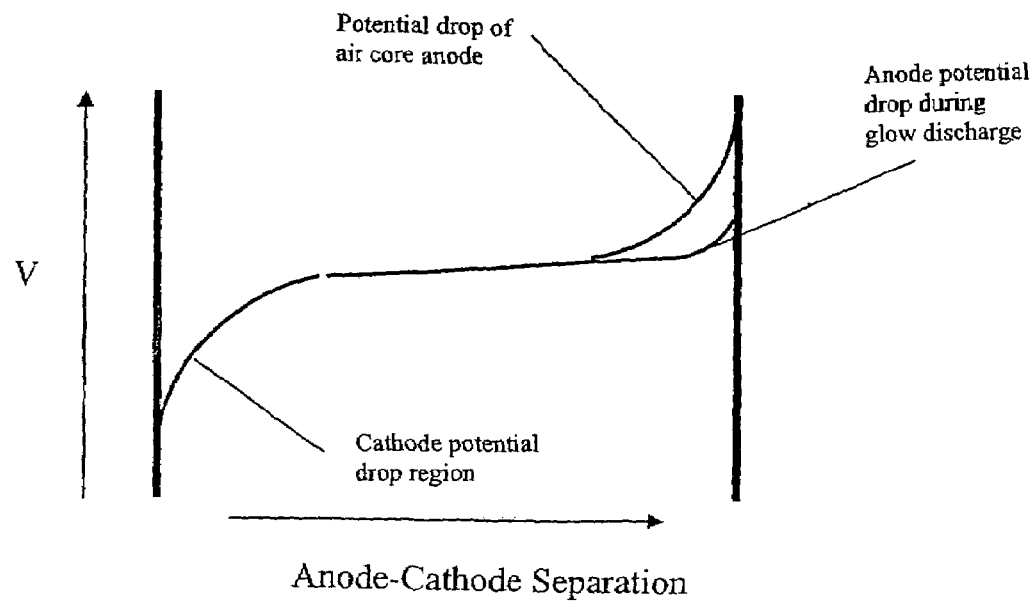
FIG. 3 illustrates the changing potential between the sample holder and the opening of the inlet conduit.

It is important to note that by applying a high negative voltage to the sample holder 6 an electric field is established that serves both to ionize the sulfur vapor entering the implantation chamber 2, and also to accelerate the resulting sulfur ions towards the surface of the sample. FIG. 2 shows as an example the potential distribution between the negatively charged sample holder 6 marked B in the Figure, and the grounded exit opening 3 marked A in the Figure when a negative voltage of 15 kV is applied to the sample holder 6. Electrons formed by the ionization of the sulfur vapor will move in the direction that the potential changes the fastest and the force on them is along the direction of an equipotential surface. Secondary electrons will also be emitted from the sample holder 6 and these electrons will also travel in the same direction and will move towards the exit opening 3 which forms the anode. The electrons resulting from the ionization of the sulfur vapor and the secondary electrons from the sample holder 6 will thus be focused on the outlet 3 and will form the electron cloud 20 shown in FIG. 1. The presence of this electron cloud 20 will in turn further assist in the generation of sulfur ions by the interaction of the electron cloud with the sulfur vapor exiting the exit opening 3. FIG. 3 illustrates the potential (shown on the y axis) between the sample holder 6 forming the cathode, and the exit opening 3 forming the anode.

As mentioned above, the vaporizing source is preferably a quasi-equilibrium source in order to control the input vapor flow and implantation stability. To achieve this quasi-equilibrium the interior of the evaporation chamber 17 is relatively large with a large internal area. The feed conduit 4 is relatively long and with a small internal diameter (eg 6 mm). The ratio of the length of the feed conduit 4 to the internal diameter should be more than 4.

In the presently described preferred embodiment of the invention, the mean free path of the vaporized sulfur atoms is much larger than the diameter of the feed conduit 4 and thus the vapor enters the feed conduit 4 in the form of a laminar flow. As discussed above, when the vapor flows into the implantation chamber a glow discharge is created under the influence of the high negative potential applied to the sample holder 6 this creating a plasma and beginning the implantation process. However, to maintain a steady-state glow discharge the pressure in the implantation chamber must exceed the breakdown pressure. An analysis of the conditions for establishing the breakdown pressure shows that the determining factors are the pressure in the evaporation chamber 17, and the length and diameter of the feed conduit 4.

In the following analysis $P_{imp}$=pressure in the implantation chamber 2

$P_{source}$=pressure in the evaporation chamber 17 (if a carrier gas is used $P_{source}$ reflects the combined pressure of the vapor and the carrier gas) and is determined by the evaporation rate and the gas flow rate $U_{tube}$=conductance of the feed conduit 4 determined by the length and diameter of the conduit 4 and the average speed of the vaporized atoms $S_{pump}$=the pumping speed of pump 9

$$P_{imp} = \frac{U_{tube} P_{source}}{U_{tube} + S_{pump}} = \frac{P_{source}}{1 + \frac{S_{pump}}{U_{tube}}} \quad (1)$$

From Eq. 1 it can be seen that by selecting an appropriate pressure in the evaporation chamber (to be determined by selecting the size of the evaporation chamber, and the applied temperature which will determine the evaporation rate), appropriate dimensions for the feed conduit 4, and a suitable pumping speed for pump 9, the pressure in the implantation chamber can be set so that in the steady state it is greater than the breakdown pressure and a steady-state glow discharge can be established.

It will also be noted that as implantation takes place if the particles in the implantation chamber 2 are used up, the pressure in the implantation chamber will fall and if it falls below the breakdown pressure the glow discharge will fail and the implantation process will stop until the pressure in the implantation chamber rises above the breakdown pressure again. To achieve stable operation therefore there should be sufficient vaporized atoms in the implantation chamber such that $P_{imp} > P_{breakdown}$. That is to say $$P_{imp} = \frac{U_{tube} P_{source}}{U_{tube} + S_{pump}} - \frac{Q_{imp}}{U_{tube} + S_{pump}}$$

and $$U_{conduit} \frac{S_{pump} P_{breakdown} + Q_{imp}}{P_{source} - P_{breakdown}}$$

Where $Q_{imp}$=particle consumption rate during implantation.

It will thus be seen that by appropriate design of the key parameters such as the length and diameter of the feed conduit 4, the evaporation rate in the evaporation chamber 17, and the pumping rate of the pump 9, a steady-state glow discharge can be established and continuous implantation of atoms into the sample can take place. Should the particle consumption be such that the pressure in the implantation chamber falls below the breakdown pressure implantation will stop but will recommence once the pressure has increased to a level above the breakdown pressure.

Figure 4:
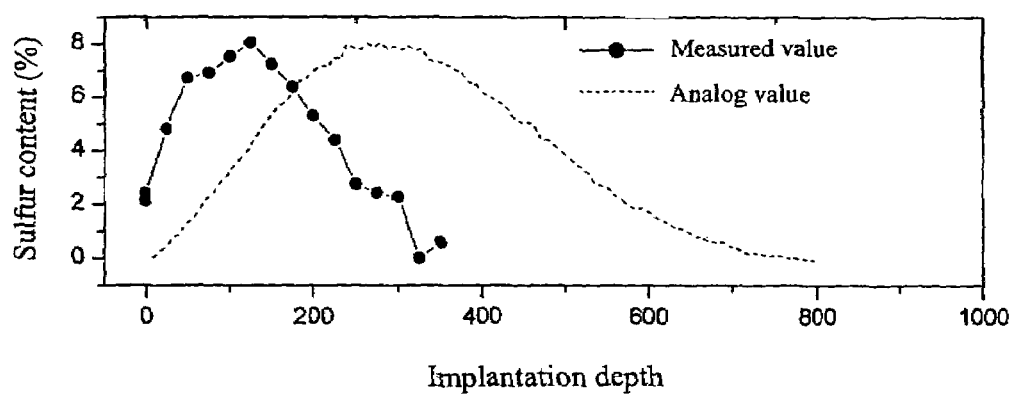
FIG. 4 shows as an example the depth of implantation of sulfur atoms using the apparatus of the embodiment of FIG. 1.

FIG. 4 is a plot showing the concentration of sulfur atoms (y axis) as a function of depth (x axis) into a silicon sample in the following example. In this example a negative voltage of 15 kV is applied to the sample holder for a period of one hour. The negative voltage was applied to the sample holder 6 as pulses at a frequency of 100 Hz and with the pulses having a duration of 250 μs. The voltage was then increased to a negative voltage of 25 kV, again pulsed as before, for a further two hours. Sulfur was evaporated from the solid state in the evaporation chamber 17 and fed through feed conduit 4 using argon as the carrier gas. FIG. 4 shows the resulting sulfur distribution using X-ray spectroscopy and shows measured results contrasted with simulated analog results (obtained using TRIM software) without carrier gas.

The invention claimed is:

1. An apparatus for focused electric field enhanced plasma-based ion implantation comprising:
   an implantation chamber,
   a vacuum pump for maintaining the pressure in said implantation chamber at a desired level,
   a sample holder,
   means for applying a negative potential to said sample holder, and
   means for supplying a gaseous or vaporized implantation material comprising a feed conduit having an exit opening located in said implantation chamber above said sample holder,
   wherein said feed conduit exit opening and said sample holder each has an area dimension, said area of said feed conduit exit opening being smaller than said area of sample holder, and
   wherein, when said negative potential is applied to said sample holder, said feed conduit exit opening is maintained at a potential that is positive relative to said sample holder.

2. The apparatus according to claim 1 wherein said apparatus further comprises an evaporating and supply means for generating vaporized implantation material and for supplying said vaporized implantation material to said inlet conduit.

3. The apparatus according to claim 2 wherein said evaporating and supply means comprises an evaporation chamber for receiving a source of said implantation material, and a heating means for generating vaporized implantation material from said source.

4. The apparatus according to claim 3 wherein said heating means surrounds said evaporation chamber.

5. The apparatus according to claim 3 wherein said evaporation chamber has an internal surface area that is formed with a neck for allowing vaporized source material to exit said evaporation chamber, said neck having a relatively small area dimension compared with the internal surface area of said evaporation chamber.

6. The apparatus according to claim 5 wherein the ratio of the area of said neck to the internal surface area of the evaporation chamber is greater than 4.

7. The apparatus according to claim 5 wherein the ratio of the area dimension of said surface of the evaporation chamber to the area dimension of said neck is greater than 4.

8. The apparatus according to claim 2 wherein said evaporating and supply means is removable from said apparatus.

9. The apparatus according to claim 1 comprising means for supplying a gaseous implantation material to said inlet conduit.

10. The apparatus according to claim 1 wherein the exit opening of said feed conduit is grounded.

11. The apparatus according to claim 1 wherein said implantation chamber is formed of an electrically insulating material.

12. The apparatus according to claim 1 wherein the ratio of the area dimension of said sample holder to the area dimension of said conduit exit opening is greater than 6.

13. The apparatus according to claim 1 wherein said feed conduit has an internal diameter dimension and a length dimension, said internal diameter dimension of the feed conduit being relatively small compared to its length dimension.

14. The apparatus according to claim 13 wherein the ratio of the length dimension of said feed conduit to its internal diameter dimension is greater than 4.

* * * * *